(12) United States Patent
Fujishima et al.

(10) Patent No.: US 7,580,690 B2
(45) Date of Patent: Aug. 25, 2009

(54) HIGH-FREQUENCY RECEIVER HAVING A GAIN SWITCH CONTROLLER

(75) Inventors: Akira Fujishima, Aichi (JP); Yasuhiro Hibino, Gifu (JP); Toshihiro Furusawa, Gifu (JP); Hirokazu Kitamura, Gifu (JP); Takashi Umeda, Shiga (JP); Takahiro Koyama, Aichi (JP)

(73) Assignee: Panasonic Corporation, Osaka (JP)

( * ) Notice: Subject to any disclaimer, the term of this patent is extended or adjusted under 35 U.S.C. 154(b) by 463 days.

(21) Appl. No.: 11/508,932

(22) Filed: Aug. 24, 2006

(65) Prior Publication Data

US 2007/0049228 A1 Mar. 1, 2007

(30) Foreign Application Priority Data

Aug. 29, 2005 (JP) ............................. 2005-247114
May 10, 2006 (JP) ............................. 2006-131342

(51) Int. Cl.
*H04B 1/06* (2006.01)
(52) U.S. Cl. .................. 455/251.1; 455/234.1; 375/345
(58) Field of Classification Search ............. 455/232.1, 455/234.1, 234.2, 241.1, 245.1, 245.2, 247.1, 455/250.1, 251.1; 375/345
See application file for complete search history.

(56) References Cited

U.S. PATENT DOCUMENTS 5,513,387 A 4/1996 Saito et al.
6,498,927 B2 * 12/2002 Kang et al. ............... 455/245.2
6,728,524 B2 * 4/2004 Yamanaka et al. ........ 455/232.1
7,068,743 B1 * 6/2006 Suzuki ....................... 375/345
7,184,730 B2 * 2/2007 Hughes et al. ........... 455/240.1
7,187,733 B2 * 3/2007 Fujishima et al. ........... 375/345
7,212,798 B1 * 5/2007 Adams et al. ............ 455/251.1

FOREIGN PATENT DOCUMENTS

| GB | 2317514 | 3/1998 |
|---|---|---|
| JP | 2005-057642 | 3/2005 |
| JP | 2005-167860 | 6/2005 |
| WO | WO 96/34452 | 10/1996 |

OTHER PUBLICATIONS

European Search Report issued Nov. 19, 2007 in a European Application which is a foreign counter part of the present application.

* cited by examiner

*Primary Examiner*—Blane J Jackson
(74) *Attorney, Agent, or Firm*—Wenderoth, Lind & Ponack, L.L.P.

(57) ABSTRACT

A high-frequency receiver capable of improving both an interference-resistant characteristic and reception sensitivity is provided. A gain switch control unit includes: a signal level determination unit comparing a gain control voltage of an amplifying circuit with a reference voltage; and a gain switch controller provided between an output terminal of the signal level determination unit and a gain control input terminal provided to an amplifying circuit for gain control. When receiving a signal in a strong electric field area having a high possibility that a strong interference signal exists, a gain of the amplifying circuit is set to be smaller than that in a case of receiving a signal in a weak electric field area by a gain switch signal output from the gain switch controller.

16 Claims, 6 Drawing Sheets

HIGH-FREQUENCY RECEIVER HAVING A GAIN SWITCH CONTROLLER

BACKGROUND OF THE INVENTION

1. Technical Field

The present invention relates to a high-frequency receiver that enables good reception even in a reception area where there is a high possibility that a strong interference signal is received or an area where a television broadcast signal is weak.

2. Background Art

FIG. 6 shows a known high-frequency receiver. High-frequency receiver 1 includes high-frequency receiving unit 2 and demodulating unit 3 connected to an output terminal of high-frequency receiving unit 2.

In high-frequency receiving unit 2, a signal received by antenna 4 is input to amplifying circuit 5 through input terminal 2a. Amplifying circuit 5 amplifies the input signal and outputs the amplified signal as an output signal. The output signal is gain-controlled by amplifying circuit 6 and is then input to first input terminal 7a of mixer 7. An output signal of oscillator 8 is input to second input terminal 7b of mixer 7. Mixer outputs a frequency-converted signal. The output signal of mixer 7 is gain-controlled by amplifying circuit 9 and is then output from output terminal 10.

The signal output from output terminal 10 is gain-controlled in amplifying circuit 11 provided in demodulating unit 3. The output signal having been gain-controlled by amplifying circuit 11 is input to a digital filter and then to digital signal demodulator 12. Digital signal demodulator 12 demodulates the received signal and outputs the demodulated signal from output terminal 13.

Japanese Patent Unexamined Publication No. 2005-57642 is an example of the related art of the invention.

However, in known high-frequency receiver 1, if a high-level interference signal is input to input terminal 2a in a frequency area close to a desired input signal, amplifying circuit 5 or mixer 7 abnormally operates due to the high-level interference signal, which makes an input signal abnormal.

In particular, a recently introduced digital broadcast signal is controlled to have a low transmission output level as possible upon transmission from a transmissive antenna so as not to interfere with an existing analog broadcast signal. Accordingly, upon reception of the digital broadcast signal, a high-level analog broadcast signal may interfere with the digital broadcast signal, which results in the abnormal reception of signals.

SUMMARY OF THE INVENTION

The invention has been finalized in order to solve the above-problems, and an object of the invention is to provide a high-frequency receiver that can improve an interference-resistant characteristic and reception sensitivity.

A high-frequency receiver according to an aspect of the invention mainly includes high-frequency receiving unit and gain switch control unit. High-frequency receiving unit includes:

(a) a first input terminal to which a signal received by antenna is input;

(b) a first amplifying circuit connected to the first input terminal;

(c) a second amplifying circuit to which an output signal of first amplifying circuit is input;

(d) a mixer having first input terminal to which an output signal of second amplifying circuit is input and second input terminal;

(e) an oscillator connected to second input terminal of mixer;

(f) a PLL circuit controlling an oscillation signal of oscillator by a PLL (phase locked loop);

(g) a third amplifying circuit to which an output signal of mixer is input;

(h) a first output terminal to which an output signal of third amplifying circuit is input;

(i) a first gain controller to which the output signal of mixer is input and which gain-controls second amplifying circuit by a first gain control voltage; and (j) a second gain controller to which the output signal of third amplifying circuit is input and which gain-controls third amplifying circuit by a second gain control voltage.

Gain switch control unit includes:

(k) a signal level determination unit comparing a predetermined reference voltage with at least one of the first and second gain control voltages output from first gain controller and second gain controller; and (l) a gain switch controller to which an output signal of signal level determination unit is input.

First amplifying circuit 41 is gain-controlled by a gain switching signal output from gain switch controller 67.

In the high-frequency receiver according to the aspect, at least one of the first and second gain control voltages output from the first and second gain controllers is compared with the predetermined reference voltage. Reference voltage set and the comparison are performed by signal level determination unit. Further, gain switch controller is connected to an output terminal of signal level determination unit. First amplifying circuit is gain-controlled by a gain switch signal output from gain switch controller.

With this configuration, in a strong electric area having a high possibility that a strong interference signal is received, the gain of first amplifying circuit is controlled to be smaller by the gain switch signal from gain switch controller. Therefore, it is possible to output a signal with suppressed signal distortion from high-frequency receiving unit.

Meanwhile, in a weak electric area, first amplifying circuit is operated with a maximum gain by the gain switch signal from gain switch controller. Therefore, it is possible to output a signal with suppressed noise from high-frequency receiving unit.

In this way, the operation state of first amplifying circuit is switched by gain switch controller, which makes it possible to provide a high-frequency receiver capable of improving the interference-resistant characteristic in a strong electric field having a high possibility that a strong interference signal is received and reception sensitivity in a weak electric field area. In particular, the high-frequency receiver according to the aspect can stably receive a signal under a circumstance in which a reception condition is remarkably changed, such as a case of receiving, for example, digital broadcast signal during movement.

DETAILED DESCRIPTION OF THE INVENTION

First Embodiment

Figure 1:
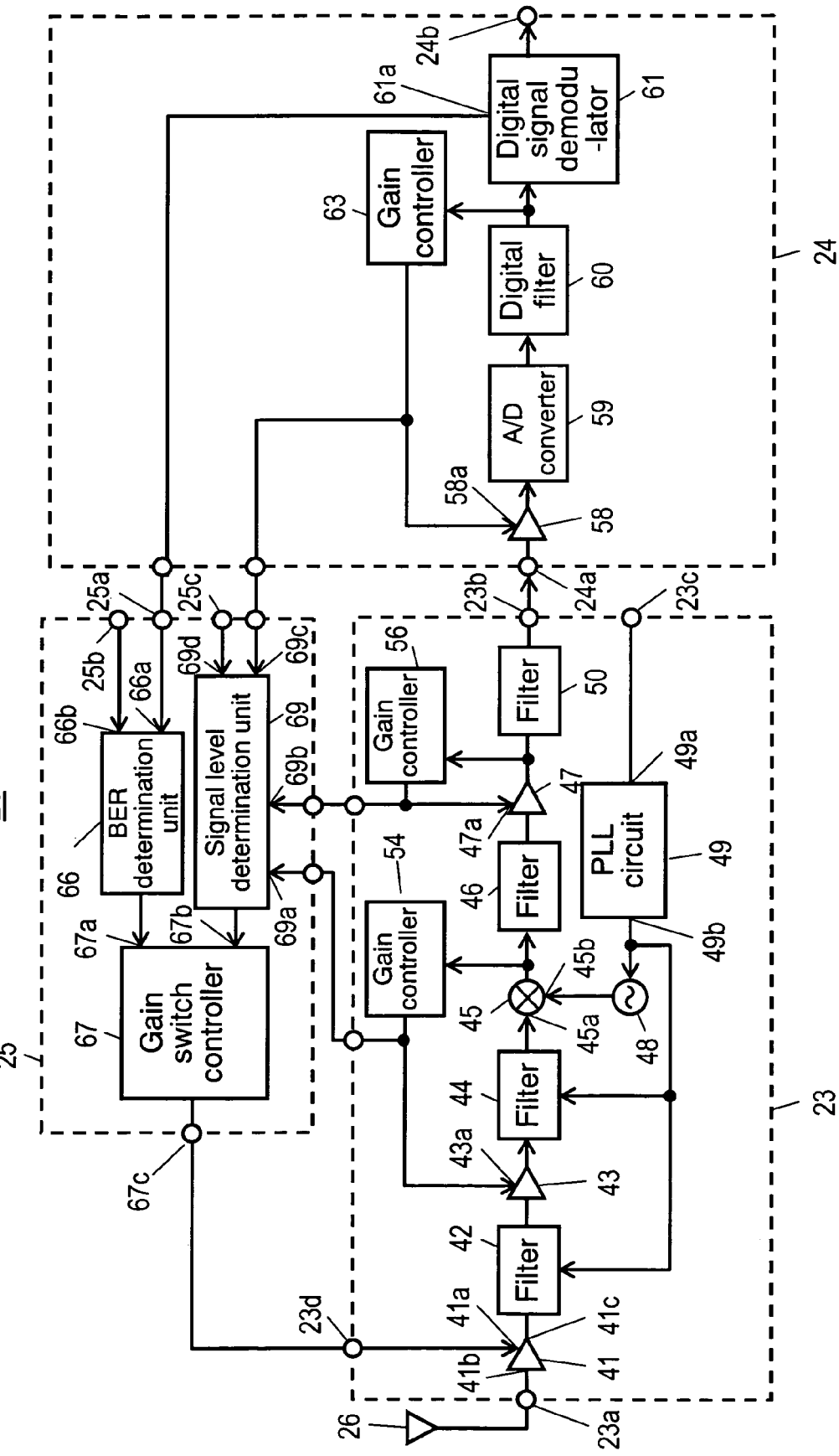
FIG. 1 is a block diagram of a high-frequency receiver according to a first embodiment of the invention.

A first embodiment of the invention will be described with reference to FIG. 1. FIG. 1 is a block diagram showing high-frequency receiver 21. In the first embodiment, high-frequency receiver 21 receiving a digital TV broadcast signal will be described as an example.

High-frequency receiver 21 mainly includes high-frequency receiving unit 23, demodulating unit 24 connected to the output terminal of high-frequency receiving unit 23, and a gain switch control unit 25 controlling high-frequency receiving unit 23.

First, the configuration of high-frequency receiving unit 23 will be described. High-frequency receiving unit 23 has first input terminal 23a connected to antenna 26 and first output terminal 23b. Between first input terminal 23a and first output terminal 23b, amplifying circuit 41 amplifying a signal, filter 42 suppressing interference signal components, amplifying circuit 43 of which the gain can be controlled by gain control input 43a, filter 44 connected to the output terminal of amplifying circuit 43 and suppressing interference signal components, mixer 45 having first input terminal 45a to which the output signal of filter 44 is input, filter 46 transmitting a frequency-converted output signal and suppressing interference signal components, amplifying circuit 47 of which the gain can be controlled by gain control input 47a, and filter 50 suppressing interference signals are connected in this order as seen from first input terminal 23a.

Second input terminal 45b of mixer 45 is connected to the output terminal of oscillator 48. A control voltage output from output terminal 49a of PLL circuit 49 is input to oscillator 48, whereby the oscillation frequency of oscillator 48 is changed. Control data input from input terminal 23c is input to input terminal 49a of PLL circuit 49. A control voltage output from output terminal 49b of PLL circuit 49 is input to tuning circuits of filters 42 and 44 so as to change tuning frequencies of filters 42 and 44. Each of filters 42 and 44 may be a variable type in which the turning frequency is variable or a fixed type.

An output signal of mixer 45 is input to filter 46 and gain controller 54 which outputs a gain control voltage. The gain control voltage output from gain controller 54 is input to gain control input terminal 43a of amplifying circuit 43.

An output signal of amplifying circuit 47 is input to filter 50 and gain controller 56 which outputs a gain control voltage. The gain control voltage output from gain controller 56 is input to gain control input terminal 47a of amplifying circuit 47.

Next, the configuration of demodulating unit 24 will be described. Demodulating unit 24 includes second input terminal 24a and second output terminal 24b. Between second input terminal 24a and second output terminal 24b, amplifying circuit 58 of which the gain is controlled by gain control input terminal 58a, A/D converter 59, digital filter 60, and digital signal demodulator 61 are connected in this order as seen from second input terminal 24a.

An output signal of digital filter 60 is input to digital signal demodulator 61 and gain controller 63. A gain control voltage output from gain controller 63 is input to gain control input terminal 58a of amplifying circuit 58.

Next, the configuration of gain switch control unit 25 will be described. Gain switch control unit 25 includes BER determination unit 66, signal level determination unit 69, and gain switch controller 67 having input terminals 67a and 67b which receive an output signal of BER determination unit 66 and an output signal of signal level determination unit 69, respectively.

BER output from output terminal 61a of digital signal demodulator 61 is input to input terminal 66a of BER determination unit 66 through input terminal 25a provided in gain switch control unit 25. Input terminal 66b of BER determination unit 66 is connected to BER input terminal 25b receiving a BER reference value. Instead of BER determination unit 66, C/N (Carrier to Noise) detector may be used.

Signal level determination unit 69 is provided with input terminals 69a, 69b, 69c, and 69d. Gain control voltages output from gain controllers 54, 56, and 63 are input to input terminals 69a, 69b, and 69c, respectively. Input terminal 69d is connected to reference voltage input terminal 25c provided in gain switch control unit 25.

The gain control voltages output from gain controllers 54, 56, and 63 are compared with reference voltages set in gain switch control unit 25, respectively, thereby determining which is higher. Through reference voltage input terminal 25c provided in gain switch control unit 25, the reference voltages can be input to input terminal 69d and can be adjusted.

On the basis of determination signals output from BER determination unit 66 and signal level determination unit 69, a gain switching signal output from gain switch controller 67 is input to gain control input terminal 41a of amplifying circuit 41 through output terminal 67c and control terminal 23d.

Subsequently, the operation of high-frequency receiver 21 configured as described above will be described with reference to FIGS. 1 and 2. The high-frequency receiver according to the first embodiment of the invention can be applied to a case of receiving only at least two analog broadcast signals or only at least two digital broadcast signals having different levels as well as a case of receiving at least two digital and analog broadcast signals having different levels.

First, the operation of high-frequency receiving unit 23 of high-frequency receiver 21 will be described with reference to FIG. 1. A signal received by antenna 26 is input to input terminal 41b of amplifying circuit 41 through first input terminal 23a. Then, a signal output from output terminal 41c of amplifying circuit 41 is input to filter 42. Filter 42 suppresses interference signals except for desired signal components. Here, the term 'desired signal components' means a regular broadcast signal of a channel desired by a user of the high-frequency receiver according to the invention.

Then, a signal output from filter 42 is input to amplifying circuit 43. The amplifying circuit 43 amplifies the received signal and outputs the amplified signal to filter 44. Filter 44 suppresses interference signal components of the input signal except for desired signal component. Then, mixer 45 receives the output signal of filter 44 through first input terminal 45a. At the same time, mixer 45 receives an output signal of oscillator 48 controlled by PLL circuit 49 through second input terminal 45b.

PLL control data is input to input terminal 49a of PLL circuit 49 through input terminal 23c. The oscillation frequency of oscillator 48 and the tuning frequencies of filters 42 and 44 are controlled by a control voltage output from output terminal 49b of PLL circuit 49. According to the above-mentioned control process, the desired signal components are selected from the received signal.

Mixer 45 outputs the desired signal components having, for example, an intermediate frequency of 8 MHz. The intermediate-frequency signal is input to filter 46 suppressing the interference signal and to gain controller 54. Filter 46 may be a fixed BPF (band pass filter), and thus can sufficiently suppress adjacent interference signal components.

The gain control voltage output from gain controller 54 is input to gain control input terminal 43a of amplifying circuit 43. Accordingly, the gain of amplifying circuit 43 is controlled such that the output signal of mixer 45 becomes a constant level.

Gain controller 54 may receive an output signal of filter 46, not an input signal input to filter 46. Since filter 46 suppresses the interference signal components, it is possible to prevent the effect of the interference signal components on a gain control system.

An output signal of Filter 46 is input to amplifying circuit 47. Amplifying circuit 47 amplifies the received signal and outputs the amplified signal to filter 50 and to gain controller 56 outputting a gain control voltage. The gain control voltage output from gain controller 56 is input to gain control input terminal 47a of amplifying circuit 47. In this way, the gain of amplifying circuit 47 is controlled such that the output signal of amplifying circuit 47 becomes a constant level.

Then, the interference signal of the output signal of amplifying circuit 47 is sufficiently suppressed by filter 50 and the output signal with suppressed interference signal is output from first output terminal 23b.

Gain controller 56 may receive an output signal of filter 50, not the input signal input to filter 50. Since filter 50 suppresses the interference signal components, it is possible to prevent the effect of the interference signal components on the gain control.

Amplifying circuits 43 and 47 amplify the signal input to first input terminal 23a with the controlled gains. Further, mixer 45 converts the frequency of the signal input to first input terminal 23a into an intermediate frequency. Furthermore, filters 42, 44, and 46 sufficiently suppress the interference signal components. Therefore, a desired signal with a constant level and an intermediate frequency is output from first output terminal 23b.

Next, the operation of demodulating unit 24 will be described. Amplifying circuit 58 receives the output signal of filter 50 through first output terminal 23b of high-frequency receiving unit 23 and second input terminal 24a, amplifies the received signal, and outputs the amplified signal to A/D converter 59. A/D converter 59 converts the amplified analog signal into a digital signal, and outputs the digital signal to digital filter 60. Digital filter 60 performs a digital signal processing on the digital signal so as to sufficiently suppress the interference signal components and outputs the processed digital signal to digital signal demodulator 61. When receiving the digital signal, digital signal demodulator 61 outputs a TS (transport stream) signal.

The output signal of digital filter 60 is input to gain controller 63 which outputs a gain control voltage. The gain control voltage output from gain controller 63 is input to gain control input terminal 58a of amplifying circuit 58. Accordingly, the gain of amplifying circuit 58 is controlled such that the level of the signal input to digital signal demodulator 61 becomes constant.

Next, the operation of BER determination unit 66 of the gain switch control unit 25 will be described. BER (Bit Error Ratio) determination unit 66 compares the BER reference value input from BER input terminal 25b with BER output from output terminal 61a of digital signal demodulator 61 and outputs a determination signal indicating the comparison result to input terminal 67a of gain switch controller 67. Instead of BER determination unit 66, a C/N detector may be used.

Figure 2:
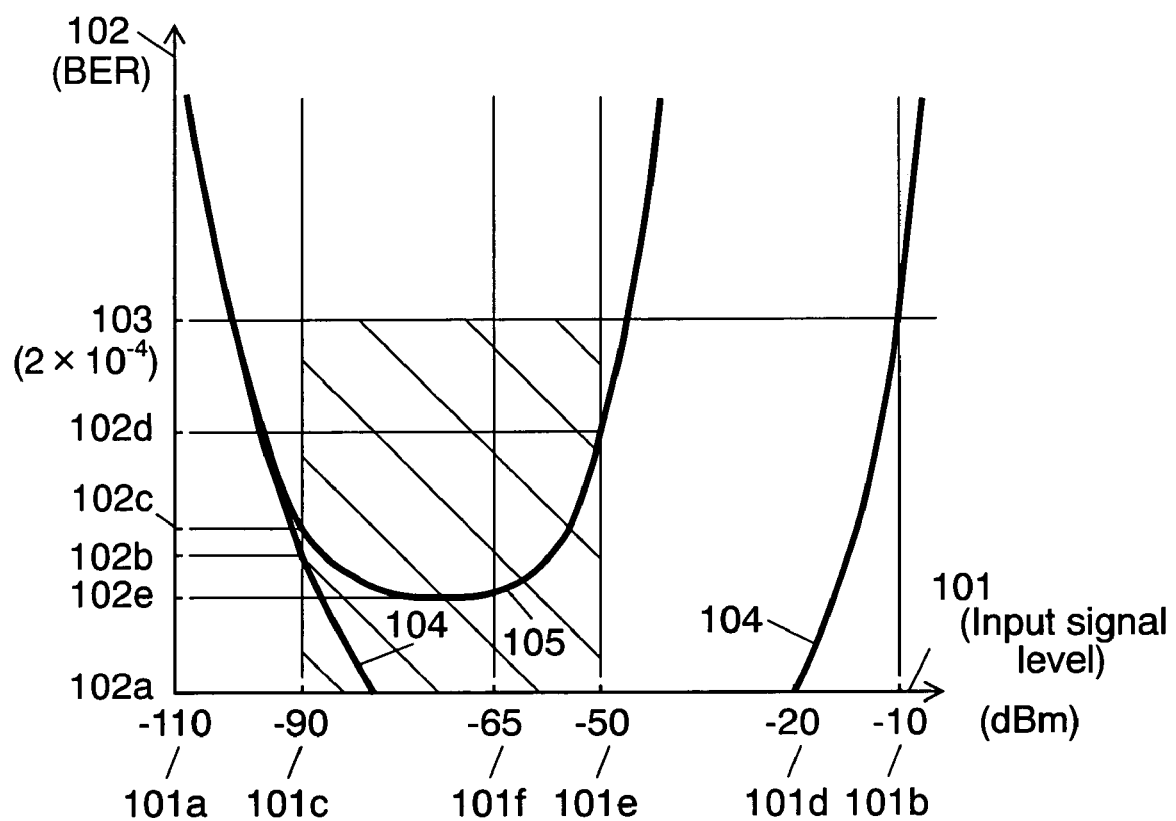
FIG. 2 is a characteristic diagram showing the relationship between BER and a desired signal and the relationship between BER and an interference signal according to the first embodiment of the invention.

FIG. 2 is a characteristic diagram illustrating the relationship between the input signal level and BER of high-frequency receiver 21. In the invention, for easy explanation, it is assumed that an area where the input signal level is higher than 50 dBm is a strong electric field area and an area where the input signal level is lower than −90 dBm is a weak electric field area.

The range in which the gain of amplifying circuit 43 is controlled corresponds to a range of 0 dBm to −50 dBm, as considering only the level of the signal input to first input terminal 23a. The gain control range of amplifying circuit 47 corresponds to a range of −50 dBm to −90 dBm as considering only the level of the signal input to first input terminal 23a. The gain control range of amplifying circuit 58 corresponds to a range of −90 dBm or less as considering only the level of the signal input to first input terminal 23a.

In FIG. 2, a faint-signal level 101a (−110 dBm) and a strong-signal level 101b (−10 dBm) are shown as the level 101 of an input signal input from the antenna 26. Further, in FIG. 2, BER 102 is shown. BER 102a represents an errorless state, in particular, a state in which no error occurs. BER 103 is $2 \times 10^{-4}$. In the invention, for easy explanation, a case in which BER 102 is larger than BER 103 ($2 \times 10^{-4}$) is defined as a state in which the reception quality is not good.

Characteristic curve 104 represents BER when only the desired signal is received. Referring to characteristic curve 104, in input signal level 101c (−90 dBm), BER 102 is BER 102b, and in input signal level 101a (−110 dBm), BER is larger as compared to the case of input signal level 101c. An increase in BER is caused by the noise figure of the high-frequency receiving unit 23 and a reception signal with many noise components.

As clearly seen from FIG. 2, in an input signal level range larger than signal level 101d (−20 dBm), as the input signal level increases, BER changes for the worse. The reason is that signal distortion is caused by the reception of a desired signal of a high level. In particular, when the level of the input signal is higher than −10 dBm, the effect of signal distortion occurring in amplifying circuits 41 and 43 and the mixer 45 is strong.

Characteristic curve 105 represents BER when an interference signal having a level higher than the level of the desired signal by 40 dBm is received. In input signal level 101c (−90 dBm), the BER is BER 102c, which is substantially equal to BER of characteristic curve 104 in input signal level 101c (−90 dBm).

In input signal level 101e (−50 dBm), an interference signal having a high level is received together with the desired signal (−50 dBm), and accordingly, the BER gets higher to BER 102d, that is, the reception quality is deteriorated. The reason is that, when an interference signal having a level higher than the desired signal by 40 dBm, signal distortion occurs in amplifying circuits 41 and 43 and mixer 45. BER 102d is close to BER 103 ($2 \times 10^{-4}$) defined as a state in which the reception quality is not good.

When input signal level 101 changes from input signal level 102e (−50 dBm) to input signal level 101f (−65 dBm), BER changes for the better from BER 102d to BER 102e. The reason is that the level of the desired signal is lowered from −50 dBm to −75 dBm and simultaneously, the level of the interference signal is lowered from −10 dBm to −25 dBm.

As described above, when input signal level 101 changes from input signal level 101e (−50 dBm) to input signal level 101f (−65 dBm), BER is remarkably improved. In order to remarkably improve BER, it is preferable to vary the gain of amplifying circuit 41 by, for example, 15 dBm or −25 dBm.

When an interference signal of a high level for the desired signal is received, BER determination unit 66 compares BER during the signal reception with the BER reference value ($2 \times 10^{-4}$). When BER during the signal reception is better than the BER reference value ($2 \times 10^{-4}$), the variation in the gain of amplifying circuit 41 is controlled to be small, for example, about 15 dBm by a gain switching signal output from gain switch controller 67.

As a result, the input signal level changes from input signal level 101e (−50 dBm) to input signal level 101f (−65 dBm). When the level of the received signal is lower than the input signal level 101c (−90 dBm), the gain of amplifying circuit 41 may return to a normal state.

BER determination unit 66 determines BER at the time of reception; however, it is not easy to exactly determine whether BER has changed for the worse due to an interference signal in a strong electric field area or due to a weak electric field.

Next, the operation of signal level determination unit 69 for determining whether BER has changed for the worse due to an interference signal in a strong electric field area or due to a weak electric field will be described. In FIG. 1, the gain control range of amplifying circuit 43 is set to correspond to a range in which the level of an input signal to the first input terminal is 0 dBm to −50 dBm. Therefore, the gain control range of amplifying circuit 47 is (−50 dBm+V1) to (−90 dBm+V1). High-frequency receiving unit 23 is configured to optimize the input signal level, suppress noise, and suppress signal distortion by performing the above-mentioned gain control. Here, V1 represents the gain from the input side of amplifying circuit 43 to the input side of amplifying circuit 47.

Next, the operation of high-frequency receiver 21 according to the levels of the desired signal and the interference signal will be described in detail. It is assumed that, in first input terminal 23a, the level of a desired digital broadcast signal is −50 dBm and the level of an analog broadcast interference signal is −10 dBm. Further, it is assumed that the level of the interference signal is suppressed by, for example, 15 dBm. The suppressed interference signal of −25 dBm is input to amplifying circuit 43. The gain of amplifying circuit 43 is controlled in an input signal level range of 0 dBm to −50 dBm at first input terminal 23a. For this reason, the gain of amplifying circuit 43 is controlled such that the level of the interference signal changes from −25 dBm to −50 dBm by 25 dBm.

The interference signal input to amplifying circuit 47 has a level of (−50 dBm+V1−Vs) which is obtained by subtracting a gain of 25 dBm from the interference signal of −25 dBm, adding the gain V1, and subtracting a suppressed amount Vs for the interference signal in filter 46.

For example, when a SAW filter is used as filter 46, it is possible to make the suppressed amount Vs equal to or greater than 40 dBm. Thus, it is possible to make the interference signal input to amplifying circuit 47 equal to or less than (−90 dBm+V1).

Similarly, the desired signal output from filter 46 has a level of (−75 dBm+V1) which is obtained by subtracting a gain of 25 dBm from the desired signal of −50 dBm, and adding the gain V1. That is, since the interference signal is suppressed by filter 46 by 25 dB from the desired signal, signal distortion is suppressed in back-stage circuits.

The desired signal (−75 dBm+V1) output from filter 46 is input to amplifying circuit 47. Amplifying circuit 47 has a gain control range of (−50 dBm+V1) to (−90 dBm+V1). Thus, for the desired signal of (−75 dBm+V1), amplifying circuit 47 executes a gain control of −15 dBm that is obtained by subtracting the lower limit (−90 dBm+V1) of the gain control range from the desired signal of (−75 dBm+V1).

Thus, amplifying circuit 47 executes a gain control of −15 dBm according to the desired signal. That is, a gain control voltage at gain control input 47a varies depending on the magnitude of the desired signal.

The magnitude of the desired signal varies depending on the magnitude of the interference signal. As the interference signal becomes strong, the gain control becomes large in amplifying circuit 43. As a result, since the desired signal input to amplifying circuit 47 becomes weak, amplifying circuit 47 is controlled such that the gain becomes larger.

That is, when a signal is received in a strong electric field area where a strong interference signal exists, signal level determination unit 69 is used to compare the gain control voltages of gain controllers 54 and 56 with the upper limit and lower limit of the reference voltage, thereby detecting the amplitude of interference signal level.

The upper and lower limits of the reference voltage set in signal level determination unit 69 can be input through reference voltage input terminal 25c. Thus, it is possible to easily set the upper and lower limits to the optimum values through reference voltage input terminal 25c provided as an external terminal of gain switch control unit 25. A determination signal output from signal level determination unit 69 is input to gain switch controller 67. Gain switch controller 67 reduces the gain of amplifying circuit 41 by, for example, 15 dBm. Thus, it is possible to reduce the interference signal, for example, by 15 dBm. As a result, it is possible to prevent distortion from occurring in amplifying circuits 41 and 43 and mixer 45, thereby improving interference-resistant characteristics of high-frequency receiver 23.

In this case, the desired signal is changed from −50 dBm to −75 dBm that is a relatively low level. As shown in characteristic curve 105 of FIG. 2, BER is not deteriorated.

When only a desired signal (equal to or more than −50 dBm) is received without an interference signal, a signal with a constant level, which is gain-controlled by amplifying circuit 43 having a gain control range (0 dBm to −50 dBm), is input to amplifying circuit 47. Thus, since the gain control voltage of amplifying circuit 47 has a minimum gain, the gain control voltage of gain controller 56 remains unchanged. In this case, the gain control voltage of gain controller 56 is equal to a gain control voltage under a reception condition in which an interference signal of a high level exists. Therefore, the comparison can be performed by using the gain control voltage, as a case in which an interference signal exists.

Next, a case in which a desired signal is received in a weak electric field area (equal to or less than −90 dBm) will be described. When a desired signal is received in a weak electric field area (equal to or less than −90 dBm), amplifying circuits 43 and 47 are controlled so as to obtain maximum gains, and a signal with a constant level, which is gain-controlled by amplifying circuit 58 having a gain control range equal to or less than −90 dBm, is input to A/D converter 59. Thus, the gain control voltage of gain controller 63 is changed.

Accordingly, it is possible to detect the magnitude of a desired signal level by using the gain control voltage of gain controller 63 to determine it by signal level determination unit

69. By gain switch controller 67 to which a determination signal output from signal level determination unit 69 is input, amplifying circuit 41 is operated in a maximum gain state. Accordingly, it is possible to improve reception sensitivity with respect to a weak signal level.

That is, in a strong electric field area having a high possibility that a high-level interference signal is input thereto, or in a strong electric field in which no interference signals exist, the gain of amplifying circuit 41 is set to be small by the gain switching signal from gain switch controller 67. Therefore, an output signal of amplifying circuit 41 has a low level, which suppresses signal distortion in amplifying circuit 43 and mixer 45. As a result, a signal with suppressed distortion is output from high-frequency receiving unit 23.

In a weak electric field area, amplifying circuit 41 operates with a maximum gain by a gain switching signal from gain switch controller 67. Thus, it is possible to output a signal with suppressed noise from high-frequency receiving unit 23.

Accordingly, it is possible to provide high-frequency receiver 21 having both an interference-resistant characteristic in a strong electric field area and reception sensitivity in a weak electric field area by switching the operational state of amplifying circuit 41 by the gain switching signal output from gain switch controller 67.

The determination signal from BER determination unit 66 is input to gain switch controller 67 through input terminal 67*a*. BER determination unit 66 compares the magnitude of the received BER with the BER reference value ($2 \times 10^{-4}$). Thus, since gain switch controller 67 performs determination using the determination signals of signal level determination unit 69 and BER determination unit 66, accuracy in determination increases.

It is required to change gain distribution for individual amplifying circuits 43, 47, and 48 or the gain control ranges of individual amplifying circuits 43, 47, and 58 of high-frequency receiving unit 23 on the basis of the interference-resistant characteristic and reception sensitivity. Only one of gain controllers 54, 56, and 63 may not be sufficient to detect the magnitudes of the desired signal and interference signal. In this case, at least two of gain controllers 54, 56, and 63 or some of at least four gain controllers may be used to more exactly detect the magnitudes of the desired signal and interference signal.

According to the above-mentioned configuration, it is possible to cope with variable reception conditions when TV broadcast signals are received during movement. Accordingly, it is possible to select optimum reception performance in a short time to correspond to a case in which a signal is received in a strong electric field area where there is a high possibility that a strong interference signal is received or a case in which a signal is received in a weak electric field area. Accordingly, the high-frequency receiving apparatus according to this embodiment of the invention is desirable when, for example, TV broadcast signals are received during movement.

An A/D converter (not shown) may be provided between gain controllers 54, 56, and 63 and the signal level determination unit, and the digital values output from the A/D converter may be processed through I2C (Inter Integrated Circuit) bus lines. In this case, since signal processing can be performed through common I2C bus lines, wiring is simplified.

Even though BER from digital signal demodulator 61 is input to BER determination unit 66 in the first embodiment of the invention, instead of BER determination unit 66, a C/N determination unit (not shown) may be used, and C/N values from digital signal demodulator 61 may be input to the C/N determination unit.

Even though super single mixer 45 is used in high-frequency receiving unit 23, a direct-conversion mixer may be used. That is, two mixers for I and Q signals are used as mixer 45, and the oscillation signals that are output from oscillator 48 and have a phase difference of 90° to each other are input to second input terminals of the mixers for I and Q signals, respectively. When the direct-conversion mixer is used, frequencies after direct-conversion become low-frequency signals of the I and Q signals. That is, since it is possible to perform signal processing at low frequencies, integration is facilitated. Further, it is possible to prevent interference between the desired signal and other signals.

Even though a case in which digital TV broadcast signals are received has been described in the first embodiment of the invention, it is applied to a case in which analog TV broadcast signals are received. That is, an analog signal demodulator (not shown) may be used, instead of digital signal demodulating unit 24, and an S/N determination unit may be used instead of BER determination unit 66. Accordingly, it is possible to obtain the same effect as described by inputting the S/N detection signal of the analog signal demodulator to the S/N determination unit and inputting a determination signal from the S/N determination unit to gain switch controller 67.

As described above, the high-frequency receiver according to the fourth embodiment of the invention can be applied to a case of receiving only at least two analog broadcast signals or only at least two digital broadcast signals having different levels as well as a case of receiving at least two digital and analog broadcast signals having different levels.

The first embodiment of the invention will be summarized as follows. That is, high-frequency receiver 21 according to the first embodiment of the invention includes first input terminal 23*a* to which a signal received by antenna 26 is input, and first amplifying circuit 41 connected to first input terminal 23*a*. Further, high-frequency receiver 21 includes: second amplifying circuit 43 receiving an output signal of first amplifying circuit 41; mixer 45 receiving an output signal of second amplifying circuit 43 through first input terminal 45*a*; and oscillator 48 connected to second input terminal 45*b* of mixer 45. Furthermore, high-frequency receiver 21 includes: PLL circuit 49 controlling an oscillation signal of oscillator 48 by PLL (phase locked loop); third amplifying circuit 47 receiving an output signal of mixer 45; and first output terminal 23*b* to which an output signal of third amplifying circuit 47 is input. In addition, high-frequency receiver 21 includes: first gain controller 54 receiving the output signal of mixer 45 and controlling the gain of second amplifying circuit 43 by a first gain control voltage; and second gain controller 56 receiving the output signal of third amplifying circuit 47 and controlling the gain of third amplifying circuit 47 by a second gain control voltage. Furthermore, high-frequency receiver 21 includes: signal level determination unit 69 in which a reference voltage is set for comparison with at least one of the first and second gain voltages output from first gain controller 54 and second gain controller 56; and gain switch controller 67 receiving an output signal of signal level determination unit 69. Then, the gain of first amplifying circuit 41 is controlled by a gain switching signal output from gain switch controller 67.

Second Embodiment

Figure 3A:
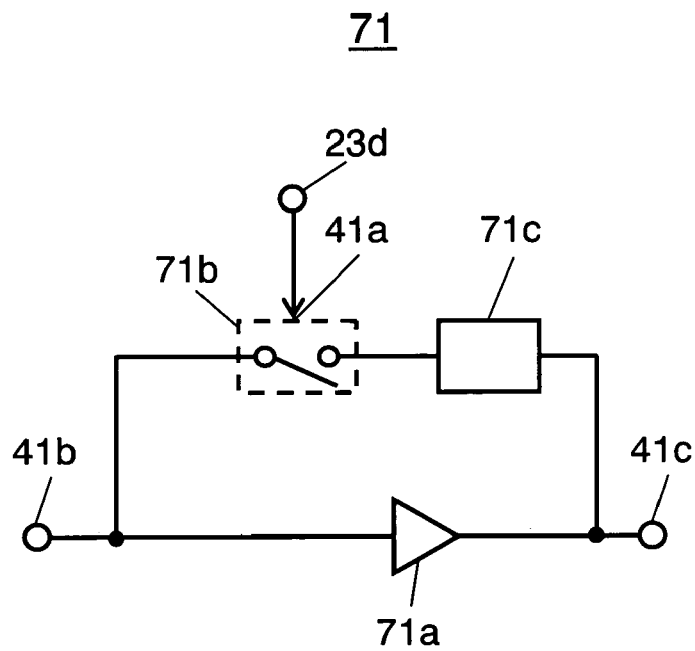
FIG. 3A is a circuit diagram of an amplifying circuit according to a second embodiment of the invention.
Figure 3B:
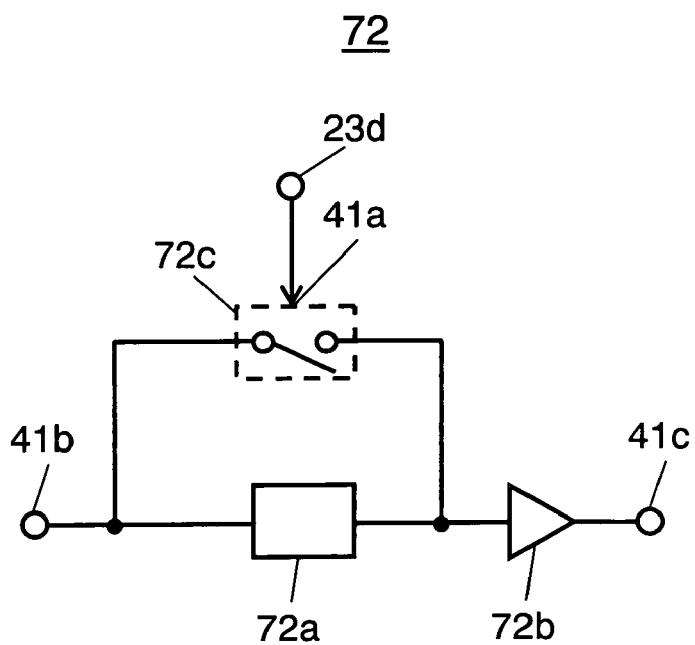
FIG. 3B is a circuit diagram of the amplifying circuit according to the second embodiment of the invention.

FIGS. 3A and 3B relate to a second embodiment of the invention. In particular, FIGS. 3A and 3B show amplifying circuits 71 and 72 as specific examples of amplifying circuit 41, respectively. The same components in FIGS. 3A and 3B as those in FIG. 1 have the same reference numerals and a description thereof will be omitted.

In amplifying circuit 71 shown in FIG. 3A, amplifier 71a is provided between input terminal 41b and output terminal 41c. Amplifier 71 is connected in parallel with a series circuit of electronic switch 71b and resistance attenuator 71c. Further, gain switch control terminal 23d is connected to gain control input terminal 41a for controlling the opening/closing of electronic switch 71b.

When amplifying circuit 71 having the above-mentioned configuration receives a gain switching signal through gain control input terminal 41a, power supply to amplifier 71a starts, and electronic switch 71b is opened. Therefore, a signal input to input terminal 41b is amplified by amplifier 71a, not resistance attenuator 71c, and is then output from output terminal 41c.

When a gain switch signal is input to gain control input terminal 41a, power supply to amplifier 71a stops and electronic switch 71b is short-circuited. In this case, the signal input to input terminal 71a passes through resistance attenuator 71c, not amplifier 71a, and is then output from output terminal 41c. In other words, when electronic switch 71b is switched from an opened state to a short-circuited state, the output signal from output terminal 41c can be set to be smaller by a magnitude obtained by adding the gain of amplifier 71a and the attenuation amount of resistance attenuator 71c. According to the magnitude obtained by the addition, it is possible to attenuate the input signal.

The use of amplifying circuit 71 makes it possible to stop the power supply to amplifier 71a, resulting in power saving. Further, it is possible to prevent signal distortion from occurring in amplifier 71a.

In the configuration having resistance attenuator 71c, when electronic switch 71b is short-circuited, it is possible to increase the signal attenuation amount by resistance attenuator 71c, and thus to set an optimal signal attenuation amount. Alternatively, electronic switch 71b may be directly connected to output terminal 41c without interposing resistance attenuator 71c therebetween.

In amplifying circuit 72 shown in FIG. 3B, resistance attenuator 72a and amplifier 72 are connected in this order between input terminal 41b and output terminal 41c as seen from input terminal 41b. Electronic switch 72c is connected in parallel with resistance attenuator 72a. Gain switch control terminal 23d is connected to gain control input terminal 41a controlling the opening/closing of electronic switch 72c.

In amplifying circuit 72 having the above-mentioned configuration, when a gain switching signal is input to gain control input terminal 41a, electronic switch 72c is opened. Therefore, an output signal of amplifier 72b passes through resistance attenuator 72a and is then output from output terminal 41.

Further, when the gain switching signal is input to gain control input terminal 41a, electronic switch 72c is short-circuited. Therefore, a signal input to input terminal 41b passes through short-circuited electronic switch 72c, is amplified by amplifier 72b. The amplified signal is output from output terminal 41c as an output signal of amplifier 72b.

In other words, when electronic switch 72c is switched from a short-circuited state to an opened state, the output signal from output terminal 41c can be set to be smaller by the attenuation amount of resistance attenuator 72a. In this way, it is possible to attenuate the input signal.

In amplifying circuit 72, since resistance attenuator 72a is connected to an input terminal of amplifier 72b, the attenuation amount by gain switch control is determined by resistance attenuator 72a. Therefore, signal distortion occurring in amplifier 72b can be reduced according to the attenuation amount in resistance attenuator 72a.

Third Embodiment

Figure 4:
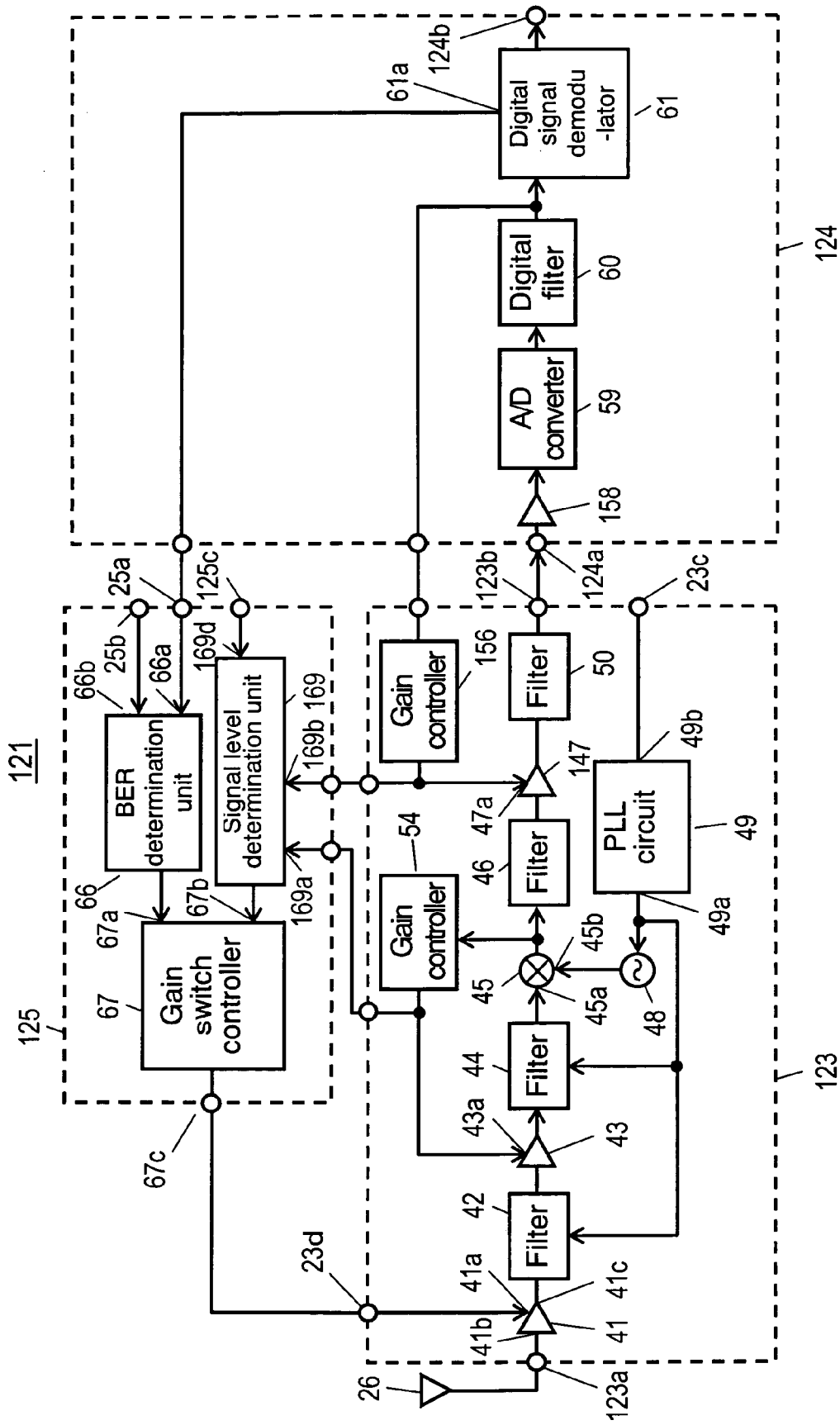
FIG. 4 is a block diagram of a high-frequency receiver according to a third embodiment of the invention.

FIG. 4 shows high-frequency receiver 121 according to a third embodiment of the invention. The same components in FIG. 4 as those in FIG. 1 have the same reference numerals, and a description thereof will be omitted.

In the first embodiment (see FIG. 1) described above, the gains of amplifying circuits 43, 47, and 58 are controlled by gain controllers 54, 56, and 63, respectively, and the gain control voltages output from these gain controllers are input to input terminals 69a, 69b, and 69c of signal level determination unit 69.

The third embodiment is different from the first embodiment in that: gain controller 63 is not used or amplifying circuit 158 with a constant gain is used instead of amplifying circuit 58; an output signal of digital filter 60 is input to an input terminal of gain controller 156; the gains of amplifying circuits 43 and 147 are controlled by gain controllers 54 and 156, respectively; and gain control voltages output from gain controllers 54 and 156 are input to input terminals 169a and 169b of signal level determination unit 169, respectively.

With this configuration, the gain control amount of amplifying circuit 147 becomes the sum of gain control amounts of amplifying circuits 47 and 58, that is, a combined gain control amount. Amplifying circuit 147 has a gain control range equal to or smaller than −50 dBm as an input signal level at input terminal 23a (123a).

In FIG. 4, high-frequency receiver 121 includes high-frequency receiving unit 123, demodulating unit 124, and gain switch control unit 125. High-frequency receiving unit 123 is connected to antenna 26 through first input terminal 123a. Demodulating unit 124 is connected to first input terminal 123b of high-frequency receiving unit 123 and has second input terminal 124a and second output terminal 124b. Gain switch control unit 125 controls the gain of amplifying circuit 41 by receiving gain control voltages output from gain controllers 54 and 156 of high-frequency receiving unit 123 and a BER signal output from output terminal 61a of digital signal demodulator 61.

As described above, high-frequency receiving unit 123 is provided with input terminal 123a and output terminal 123b. An output signal of digital filter 60 is input to input terminal 156a of gain controller 156. Signal level determination unit 169 is provided with input terminals 169a, 169b, and 169d. Gain control voltages of gain controllers 54 and 156 are input to input terminals 169a and 169b, respectively. Input terminal 169d is connected to reference voltage input terminal 125c of gain switch control unit 125. Output terminal 67c of gain switch controller 67 is connected to gain control input terminal 41a of amplifying circuit 41 through gain switch control terminal 23d.

The operation of high-frequency receiving unit 121 having the above-mentioned configuration is basically the same as the high-frequency receiver of FIG. 1, and thus a detailed description thereof will be omitted.

A received signal input to first input terminal 123a is frequency-converted by mixer 45 and simultaneously is gain-controlled in amplifying circuits 43 and 147 such that signal levels output from first output terminal 123b become constant.

In a strong electric field area having a high possibility that a strong interference signal exists, signal level determination unit 169 is used to compare gain control voltages of gain controllers 54 and 156 with upper and lower limits of a reference voltage of each of gain controllers 54 and 56, thereby detecting the level of the interference signal.

The upper and lower limits of the reference voltage of signal level determination unit 169 can be input or adjusted through reference voltage input terminal 125c. Since reference voltage input terminal 125c is an external terminal provided in gain switch control unit 125, it is possible to easily set the reference voltage to an optimum value.

A determination signal from signal level determination unit 169 is input to input terminal 67b of gain switch controller 67. A gain switching signal output from gain switch controller 67 is input to gain control input terminal 41a through output terminal 67c and gain switch control terminal 23d so as to switch the gain of amplifying circuit 41.

Thus, since the interference signal can be reduced by, for example, 15 dB, it is possible to prevent signal distortion from occurring in amplifying circuits 43 and 147 and mixer 45, thereby improving interference-resistant characteristics of high-frequency receiver 121. At this time, a desired signal is reduced from −50 dBm to −75 dBm, which is a relatively low level, and BER is not deteriorated, as shown in characteristic curve 105 of FIG. 2.

When only a desired signal (equal to or more than −50 dBm) is received without an interference signal, a signal with a constant level that is gain-controlled by amplifying circuit 43 having a gain control range of 0 dBm to −50 dBm is input to amplifying circuit 147. Thus, since gain control voltage of amplifying circuit 147 has a minimum gain, the gain control voltage of gain controller 156 remains unchanged.

In this case, the gain control voltage is equal to the gain control voltage under a reception condition in which a strong interference signal exists. Accordingly, it is possible to compare the magnitude of the desired signal level with the gain control voltage to perform determination in signal level determination unit 169.

Next, a case in which a desired signal is received in a weak electric field area (equal to or less than −90 dBm) will be described. When a desired signal is received in a weak electric field area (equal to or less than −90 dBm), amplifying circuit 43 is controlled so as to obtain a maximum gain, and a signal with a constant level that is gain-controlled by amplifying circuit 147 is input to A/D converter 59. Thus, the gain control voltage of gain controller 156 is changed.

Accordingly, it is possible to compare the magnitude of the desired signal level with the gain control voltage of gain controller 156 to perform determination in signal level determination unit 169. When the desired signal level is equal to or less than −90 dBm, a determination signal from signal level determination unit 169 makes the gain of amplifying circuit 41 become a maximum value. Therefore, the reception sensitivity for a weak signal level is improved.

As described above, when a signal is received in a strong electric field area having a high possibility that a strong interference signal exists, the gain of amplifying circuit 41 is reduced by a gain switching signal from gain switch controller 67. Thus, it is possible to output a signal with little distortion from high-frequency receiving unit 123.

When a signal is received in a weak electric field area, amplifying circuit 41 operates with a maximum gain by a gain switching signal from gain switch controller 67. Thus, it is possible to output a signal with little noise from high-frequency receiving unit 123.

In this way, the gain of amplifying circuit 41 is switched by using the gain control signal output from gain switch controller 67. Accordingly, it is possible to provide high-frequency receiver 121 satisfying both an interference-resistant characteristic in a strong electric field area and reception sensitivity in a weak electric field area.

A determination signal from BER determination unit 66 is input to gain switch controller 67. BER determination unit 66 compares the magnitude of the received BER with the BER reference value ($2 \times 10^{-4}$). Thus, since gain switch controller 67 performs determination using the determination signals of signal level determination unit 169 and BER determination unit 66, accuracy in determination increases.

It is required to adjust the gain distribution for individual amplifying circuits 43, 147, and 158 or the gain control ranges of individual amplifying circuits 43, 147, and 158 on the basis of the interference-resistant characteristic and reception sensitivity. Then, only one of gain controllers 54 and 156 may not be sufficient to detect the magnitudes of the desired signal and interference signal. In this case, gain controllers 54 and 156 may be used to detect the magnitudes of the desired signal and interference signal.

The gain control voltages are configured to cope with variable reception conditions. Accordingly, it is possible to select the optimum reception performance in a short time to correspond to a case in which a signal is received in a strong electric field area or a weak electric field area or a case in which a signal is received in a reception area where a strong interference signal exists. Accordingly, high-frequency receiver 121 according to third embodiment of the invention is desirable to select a desired signal from, for example, TV broadcast signals during movement.

Even though super single mixer 45 is used in high-frequency receiving unit 123, a direct-conversion mixer may be used. That is, two mixers for I and Q signals are used as mixer 45, and the oscillation signals that are output from oscillator 48 and have a phase difference of 90° to each other are input to the mixers for I and Q signals.

When the direct-conversion mixer is used, frequencies after direct-conversion become low-frequency signals of the I and Q signals. That is, since it is possible to perform signal processing at low frequencies, integration of circuits or electronic components constituting high-frequency receiving unit 123 is facilitated. Further, it is possible to prevent the interference between the desired signal and other signals.

Even though a case in which digital TV broadcast signals are received has been described in the third embodiment of the invention, it may be applied to a case in which analog TV broadcast signals are received. That is, an analog signal demodulator may be used, instead of digital signal demodulating unit 124, and an S/N detection signal from the analog signal demodulator may be used. Accordingly, it is possible to obtain the same effect by inputting the S/N detection signal to the S/N determination unit, instead of BER determination unit 66, and inputting a determination value output from the S/N determination unit to gain switch controller 67.

Fourth Embodiment

Figure 5:
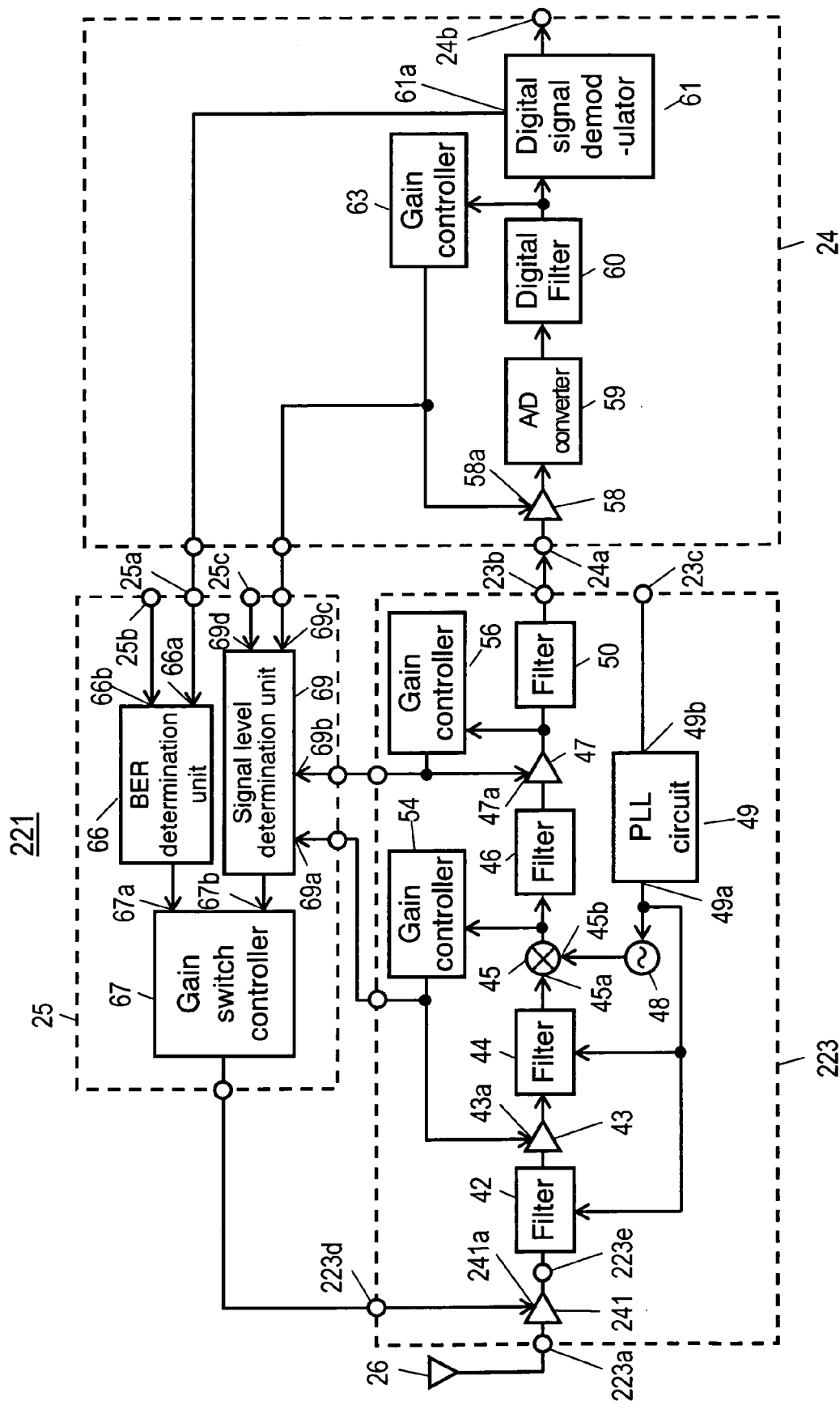
FIG. 5 is a block diagram of a high-frequency receiver according to a fourth embodiment of the invention.
Figure 6:
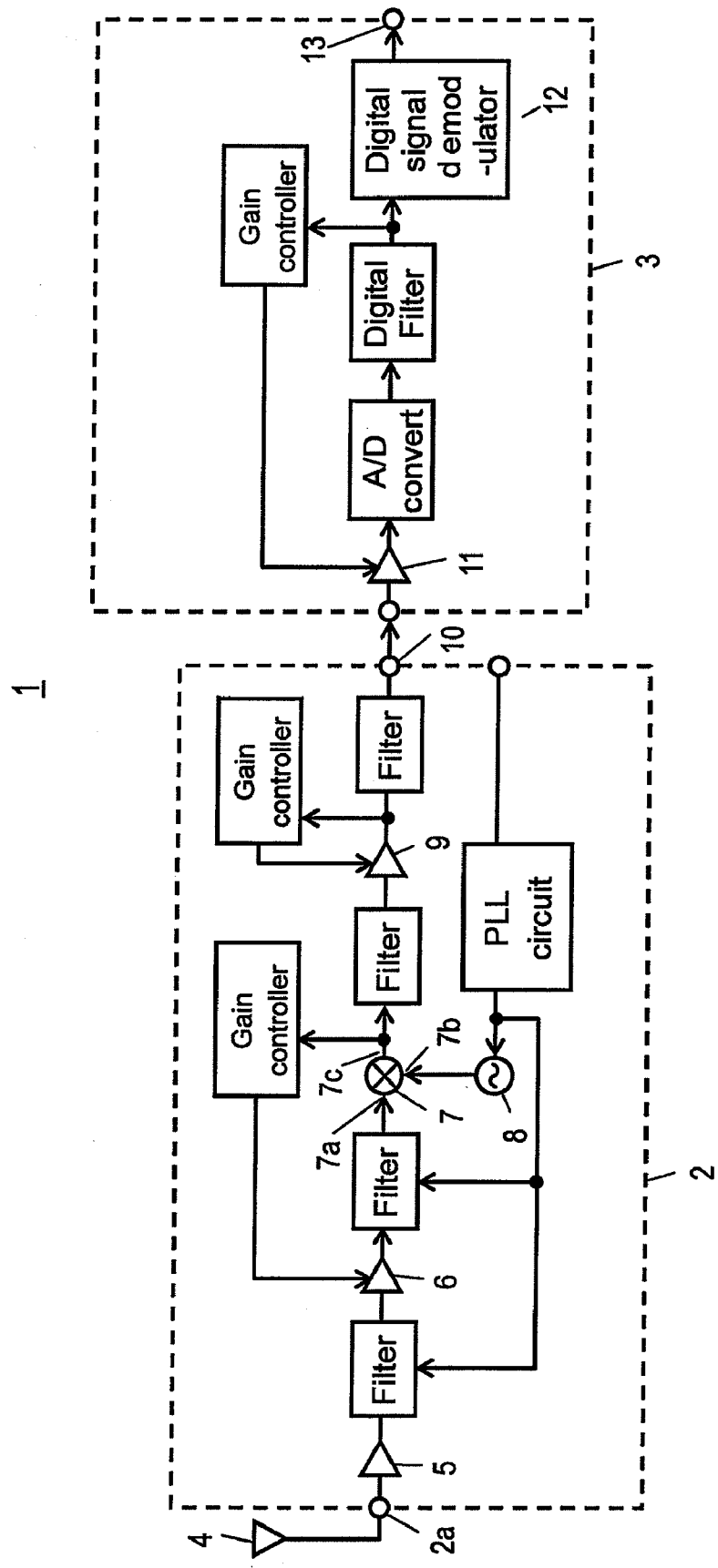
FIG. 6 is a block diagram of a high-frequency receiver according to the related art.

FIG. 5 is a block diagram showing high-frequency receiver 221 according to a fourth embodiment of the invention.

In the fourth embodiment, at least amplifying circuit 43, mixer 45, oscillator 48, and amplifying circuit 47 according to the first embodiment are integrated into an IC. Further, amplifying circuit 241 is connected between input terminal 223e provided in the IC and input terminal 223a connected to antenna 26. The same components in FIG. 5 as those in FIG. 1 are denoted by the same reference numerals, and a description thereof will be omitted.

In FIG. 5, high-frequency receiver 221 includes: high-frequency receiving unit 223; demodulating unit 24 connected to an output terminal of high-frequency receiving unit 223; and gain switch control unit 25 controlling high-frequency receiving unit 223.

In order to provide high-frequency receiving unit 223 in a cellular phone, it is required to have a small size and low power consumption. For this reason, at least amplifying circuit 43, mixer 45, oscillator 48, and amplifying circuit 47 of high-frequency receiving unit 223 are integrated into an IC, resulting in low power consumption.

However, when power consumption is lowered, signals are severely distorted in amplifying circuits 43 and 47 and mixer 45, causing reception quality to be deteriorated, and the integration increases the noise figure. In order to prevent the signal distortion and to reduce the noise figure, in the fourth embodiment, amplifying circuit 241 that rarely distorts signals and has a low noise figure is externally provided between input terminal 223e and input terminal 223a.

A gain switch signal output from gain switch controller 67 is input to gain control input terminal 241a of amplifying circuit 241. Amplifying circuit 71 shown in FIG. 3A or amplifying circuit 72 shown in FIG. 3B may be used as amplifying circuit 241.

The operation of high-frequency receiver 221 having the above-mentioned configuration is almost the same as that in the first embodiment. Therefore, a description of the same portions will be omitted and only different portions will be described.

In a strong electric field area that can be expected to have a high possibility of receiving a strong interference signal, the gain of amplifying circuit 241 is set to be small by a gain switching signal from gain switch controller 67. Therefore, an output signal of amplifying circuit 241 has a low level. In this way, it is possible to prevent signal distortion from occurring in amplifying circuit 43 and mixer 45 and to output a signal without distortion from high-frequency receiving unit 223.

Meanwhile, in a weak electric field area, amplifying circuit 241 operates with a maximum gain by the gain switching signal from gain switch controller 67. Amplifying circuit 241 reduces the noise figure of high-frequency receiving unit 223. Therefore, high-frequency receiving unit 223 outputs a signal with suppressed noise.

Amplifying circuit 71 shown in FIG. 3A or amplifying circuit 72 shown in FIG. 3B may be used as amplifying circuit 241. Therefore, when a signal is received in a weak electric field area, amplifier 71a or 72a is operated, and when a signal is received in a strong electric field area, the signal passes through switch 71b, not amplifier 71a. That is, amplifying circuit 71 performs the same operation as that of a configuration without amplifier 41. In this case, when power supply to amplifier 71a or 72a stops, the power consumption is saved.

As described above, at least amplifying circuit 43, mixer 45, oscillator 48, and amplifying circuit 47 are integrated into an IC, and amplifying circuit 241 is connected between input terminal 223e and input terminal 223a provided to the IC. It is possible to provide high-frequency receiver 221 having both an interference-resistant characteristic in a strong electric field area and reception sensitivity in a weak electric field area by switching the operational state of amplifying circuit 241 by the gain switching signal.

Gain switch controller 67 may use at least one of the gain control voltages of gain controllers 54, 56, and 63 without using the determination signal from BER determination unit 66. When signals are received during movement, since the time required to calculate BER is unnecessary, the gain control voltage can cope with variable reception conditions. Accordingly, it is possible to select optimum reception performance in a short time to correspond to a case in which a signal is received in a strong electric field area that is expected to have a high possibility that a strong interference signal exists or a case in which a signal is received in a weak electric field area. Accordingly, the high-frequency receiving apparatus according to the fourth embodiment of the invention is desirable when, for example, TV broadcast signals are received during movement.

Even though super single mixer 45 is used in high-frequency receiving unit 223, a direct-conversion mixer may be used. That is, two mixers for I and Q signals are used as mixer 45, and the oscillation signals that are output from oscillator 48 and have a phase difference of 90° to each other are input to second input terminals of the mixers for I and Q signals, respectively. When the direct-conversion mixer is used, frequencies after direct-conversion become low-frequency signals of the I and Q signals. That is, since it is possible to perform signal processing to low frequencies, integration is facilitated. Further, it is possible to prevent interference between the desired signal and other signals.

Even though a case in which digital TV broadcast signals are received has been described in the fourth embodiment of the invention, it may be applied to a case in which analog TV broadcast signals are received. That is, an analog signal demodulator may be used, instead of digital signal demodulating unit 24, and an S/N determination unit may be used, instead of BER determination unit 66. Accordingly, it is possible to obtain the same effect by inputting the S/N detection signal output from the analog signal demodulator to the S/N determination unit and inputting a determination signal output from the S/N determination unit to gain switch controller 67.

As described above, the high-frequency receiver according to the fourth embodiment of the invention can be applied to a case of receiving only at least two analog broadcast signals or only at least two digital broadcast signals having different levels as well as a case of receiving at least two digital and analog broadcast signals having different levels.

In the third embodiment (see FIG. 4) described above, even though high-frequency receiving unit 223 is used instead of high-frequency receiving unit 123, the same effect is obtained. In other words, at least amplifying circuit 43, mixer 45, oscillator 48, and amplifying 147 may be integrated into an IC, and amplifying circuit 241 may be used instead of amplifying circuit 41.

What is claimed is:
1. A high-frequency receiver comprising:
a first input terminal to which a signal received by an antenna is input;
a first amplifying circuit connected to the first input terminal;
a second amplifying circuit to which an output signal of the first amplifying circuit is input;
a mixer having a first input terminal to which an output signal of the second amplifying circuit is input and a second input terminal;
an oscillator connected to the second input terminal of the mixer;
a PLL circuit controlling an oscillation signal of the oscillator by a PLL;
a third amplifying circuit to which an output signal of the mixer is input;
a first output terminal to which an output signal of the third amplifying circuit is input;
a first gain controller to which the output signal of the mixer is input and which gain-controls the second amplifying circuit by a first gain control voltage;

a second gain controller to which the output signal of the third amplifying circuit is input and which gain-controls the third amplifying circuit by a second gain control voltage;

a signal level determination unit for comparing a predetermined reference voltage with at least one of the first and second gain control voltages output from the first gain controller and the second gain controller; and a gain switch controller to which an output signal of the signal level determination unit is input, wherein the first amplifying circuit is gain-controlled by a gain switching signal output from the gain switch controller.

2. The high-frequency receiver according to claim 1, wherein the signal level determination unit is provided with a reference voltage input terminal and compares the reference voltage with at least one of the first and second gain control voltages.

3. The high-frequency receiver according to claim 1, wherein the first amplifying circuit is composed of a series circuit of a resistance attenuator composed of a resistor and an electronic switch, and the electronic switch is opened or closed by a control signal output from the gain switch controller.

4. The high-frequency receiver according to claim 1, wherein the first amplifying circuit includes:

a series circuit of an amplifier and a resistance attenuator composed of a resistor on an input side; and an electronic switch connected in parallel with the resistance attenuator, and the electronic switch is opened or closed by a control signal output from the gain switch controller.

5. The high-frequency receiver according to claim 1, wherein gain control voltages output from the first and second gain controllers are converted into digital signals by an A/D converter, and the digital signals are input to the signal level determination unit through I2C bus lines.

6. The high-frequency receiver according to claim 1, wherein the mixer is a direct-conversion mixer.

7. The high-frequency receiver according to claim 1, wherein at least the second amplifying circuit, the mixer, the oscillator, and the third amplifying circuit are integrated into a single IC, and the first amplifying circuit is connected between an input terminal of the IC and the antenna.

8. The high-frequency receiver according to claim 1, further comprising:

a demodulating unit to which an output signal from a high-frequency receiving unit is input through a second input terminal, wherein the demodulating unit includes:

a fourth amplifying circuit to which a signal is input through the second input terminal;

a digital signal demodulator which receives an output signal of the fourth amplifying circuit and outputs a demodulated signal; and a third gain controller which receives the input signal of the digital signal demodulator and gain-controls the fourth amplifying circuit by a third gain control voltage, and the signal level determination unit compares at least one of the first, second and third gain control voltages with the predetermined reference voltage.

9. The high-frequency receiver according to claim 8, wherein the first, second and third gain control voltages output from the first, second and third gain controllers are converted into digital signals by an A/D converter, and the digital signals are input to the signal level determination unit through I2C bus lines.

10. The high-frequency receiver according to claim 8, wherein the gain switch controller is provided with a BER determination unit comparing BER output from the digital signal demodulator with a BER reference value, and determination signals from the BER determination unit and the signal level determination unit are input to the gain switch controller.

11. The high-frequency receiver according to claim 10, wherein the BER determination unit is provided with a BER input terminal to which the BER reference value to be compared with BER output from the demodulating unit is input.

12. The high-frequency receiver according to claim 8, wherein the gain switch controller is provided with a C/N determination unit comparing a C/N output from the digital signal demodulator with a C/N reference value, and output signals from the C/N determination unit and the signal level determination unit are input to the gain switch controller.

13. The high-frequency receiver according to claim 12, wherein the C/N determination unit is provided with a C/N input terminal to which the C/N reference value to be compared with a C/N output from the demodulating unit is input.

14. The high-frequency receiver according to claim 1, further comprising:

a demodulating unit to which an output signal from a high-frequency receiving unit is input through a second input terminal, wherein the demodulating unit includes a digital signal demodulator which receives a signal from the second input terminal and outputs a demodulated signal, the input signal of the digital signal demodulator is input to the second gain controller instead of the output signal of the third amplifying circuit; and the signal level determination unit compares at least one of the first and second gain control voltages with the predetermined reference voltage.

15. The high-frequency receiver according to claim 1, further comprising:

a demodulating unit to which an output signal from a high-frequency receiving unit is input through a second input terminal, wherein the demodulating unit includes an analog signal demodulator which receives a signal from the second input terminal and outputs a demodulated signal, the input signal of the analog signal demodulator is input to the second gain controller instead of the output signal of the second amplifying circuit, and the signal level determination unit compares at least one of the first and second gain control voltages with the predetermined reference voltage.

16. The high-frequency receiver according to claim 15, wherein the gain switch controller is provided with an S/N determination unit comparing a S/N output from the demodulating unit with an S/N reference value, determination signals output from the S/N determination unit and the signal level determination unit are input to the gain switch controller, and a control signal of the gain switch controller is input to a gain control input terminal.

* * * * *